US010174927B2

(12) United States Patent
Nakamura

(10) Patent No.: US 10,174,927 B2
(45) Date of Patent: Jan. 8, 2019

(54) LED ILLUMINATION DEVICE WITH HEAT SINK HAVING A PORTION OF HEAT FINS EXPOSED TO AXIAL FORCED FLOW FROM A COOLING FAN

(71) Applicant: Shoichi Nakamura, Nagano-ken (JP)

(72) Inventor: Shoichi Nakamura, Nagano-ken (JP)

(73) Assignees: Shoichi Nakamura, Higashichikuma-Gun, Nagano-Ken (JP); ACP JAPAN CO., LTD., Tokyo (JP)

(*) Notice: Subject to any disclaimer, the term of this patent is extended or adjusted under 35 U.S.C. 154(b) by 33 days.

(21) Appl. No.: 15/477,595

(22) Filed: Apr. 3, 2017

(65) Prior Publication Data

US 2017/0284648 A1 Oct. 5, 2017

(30) Foreign Application Priority Data

Apr. 4, 2016 (JP) .................. 2016-075096

(51) Int. Cl.
| | | |
|---|---|---|
| *F21V 29/503* | (2015.01) | |
| *F21V 29/67* | (2015.01) | |
| *F21V 29/76* | (2015.01) | |
| *H01L 33/48* | (2010.01) | |
| *F21V 29/83* | (2015.01) | |
| *F21Y 115/10* | (2016.01) | |

(52) U.S. Cl.
CPC .......... *F21V 29/673* (2015.01); *F21V 29/503* (2015.01); *F21V 29/677* (2015.01); *F21V 29/767* (2015.01); *H01L 33/486* (2013.01); *F21V 29/83* (2015.01); *F21Y 2115/10* (2016.08)

(58) Field of Classification Search
CPC ...... F21V 29/503; F21V 29/67; F21V 29/673; F21V 29/76; F21V 29/767; F21V 19/0015; F21V 19/002; F21V 19/0025; F21L 14/02
See application file for complete search history.

(56) References Cited

U.S. PATENT DOCUMENTS

| | | | | |
|---|---|---|---|---|
| 6,824,294 | B2 * | 11/2004 | Cao ...................... | A61C 19/004 257/707 |
| 6,864,513 | B2 * | 3/2005 | Lin ..................... | H01L 25/0753 257/99 |
| 7,144,140 | B2 * | 12/2006 | Sun ........................ | F21K 9/233 362/373 |
| 7,244,051 | B2 * | 7/2007 | Bewig ...................... | F21V 7/22 362/345 |
| 7,524,089 | B2 * | 4/2009 | Park ........................ | F21V 3/02 362/294 |
| 7,534,015 | B2 * | 5/2009 | Xu ............................ | F21K 9/00 362/373 |

(Continued)

FOREIGN PATENT DOCUMENTS

| | | |
|---|---|---|
| JP | 2007-042755 A | 2/2007 |
| JP | 2011-165351 A | 8/2011 |

*Primary Examiner* — Ismael Negron
(74) *Attorney, Agent, or Firm* — Manabu Kanesaka

(57) ABSTRACT

An LED illumination device includes an LED device; a base having a concavity for receiving the LED device; a heat sink including a plate coupled to the base and a plurality of fins extending from a surface of the plate opposite the base, the fins extending laterally beyond sides of the plate; a cooling fan for forcing air over the fins; and a casing housing the LED substrate, the base, the heat sink, and the cooling fan.

3 Claims, 9 Drawing Sheets

(56) References Cited

U.S. PATENT DOCUMENTS

| | | | | |
|---|---|---|---|---|
| 7,654,675 | B2* | 2/2010 | Ko | G03B 21/16 353/52 |
| 8,057,071 | B2* | 11/2011 | He | F21K 9/233 362/234 |
| 8,066,414 | B2* | 11/2011 | Pabst | F21V 29/677 362/373 |
| 8,083,383 | B2* | 12/2011 | Chen | F21V 29/507 362/294 |
| 8,115,395 | B2* | 2/2012 | Horng | F21V 29/02 315/117 |
| 2008/0055909 | A1* | 3/2008 | Li | F21K 9/00 362/294 |
| 2009/0002946 | A1* | 1/2009 | Horng | F21V 29/02 361/697 |

* cited by examiner

LED ILLUMINATION DEVICE WITH HEAT SINK HAVING A PORTION OF HEAT FINS EXPOSED TO AXIAL FORCED FLOW FROM A COOLING FAN

RELATED APPLICATIONS

The present application is based on, and claims priority from, Japanese Application No. JP2016-075096 filed Apr. 4, 2016, the disclosure of which is hereby incorporated by reference herein in its entirety.

BACKGROUND OF THE INVENTION

Field of the Invention

The present invention relates to an LED illumination device provided with a heat sink and a cooling fan.

Description of the Related Art

Conventionally, various illumination devices using a high-efficiency and long life LED element are put to practical use. However, in such illumination devices using the LED element, when temperature inside a main body casing of the device becomes high by heat generated from the LED element, LED light emission efficiency is degraded to reduce the quantity of light output from the illumination device, and the service life of the LED element is reduced.

Thus, the LED illumination devices are generally provided with a plurality of fins on the back side of a substrate on the front side of which the LED element is mounted to cool the LED element (see, for example, Patent Document 1). Further, there are known LED illumination devices that use a fan device to cool the LED element (see, for example, Patent Document 2).

PRIOR ART DOCUMENT

Patent Document

[Patent Document 1] Japanese Patent Application Publication No. 2007-42755
[Patent Document 2] Japanese Patent Application Publication No. 2011-165351

Among such various illumination devices using the LED element, there are known downsized LED illumination devices that are used by being attached to a wearing article such as glasses or a headband or clothing. When such an illumination device is attached to a person's head, the face direction coincides with the light irradiation direction, so that illumination along the visual line direction is possible. Thus, illumination devices of such a type are optimal for use in local illumination of the hands of a worker, etc.

However, in the downsized LED illumination device, a heat radiation amount is small since the entire surface area is small. Thus, even though a plurality of fins formed on the back side of the substrate mounted with the LED element are fitted to a groove part formed in the casing of the illumination device so as to increase a contact area between the substrate and the casing as in the LED illumination device of JP 2007-42755A, high heat radiation effect cannot be obtained since the sizes of the substrate and casing are limited.

Further, when the fan is used to form an air flow path along which air is introduced from outside to the LED element in an illumination part as in the LED illumination device of JP 2011-165351A, airtightness in the illumination part is degraded, which may result in reduction in illuminance due to dust and moisture entering the casing.

SUMMARY OF THE INVENTION

The present invention has been made in view of the above points, and the object thereof is to provide an LED illumination device capable of efficiently cooling the LED element using a cooling fan while maintaining airtightness inside the illumination part.

To solve the above problems, an LED illumination device of the present invention includes: an LED substrate on which an LED package is mounted; a base having a concave part for housing the LED substrate; a heat sink; a cooling fan; and a casing housing the LED substrate, base, heat sink, and cooling fan. The heat sink is constituted of a rectangular flat plate which is thermally connected to a surface of the base opposite to the surface in which the concave part is formed and a plurality of rib-shaped first heat radiation fins which are disposed on a heat radiation surface of the flat plate opposite to the surface thereof thermally connected to the base such that both ends of each thereof protrude outward from a pair of opposing sides of the flat plate. The base is formed into a shape from which the part of each first heat radiation fin that protrudes from the flat plate is exposed in a state where the first heat radiation fins are disposed on the heat radiation surface. The cooling fan takes in air from outside the casing in a substantially perpendicular direction with respect to the heat radiation surface and forms an air passage along which the taken-in air passes through the both ends of each first heat radiation fin and goes out of the casing.

In this case, by making the rotation diameter of the cooling fan substantially equal to the dimension of the first heat radiation fins in its linear direction, air taken in by the heat radiation fan hits the heat sink in the axial direction, thereby achieving efficient heat exchange.

Further, a plurality of second heat radiation fins are formed so as to protrude outward by substantially the same dimension as that of the first heat radiation fin from the end portion of a side of the flat plate other than the pair of opposing sides thereof from which the both ends of each heat radiation fins protrude, and the base is formed into a shape from which the second heat radiation fins protrude. This configuration enhances heat radiation efficiency.

Further, the LED substrate has a through hole so as to allow air in the illumination part to directly contact the base. This configuration enhances heat conductivity to the base.

According to the LED illumination device of the present invention, heat is absorbed by the heat sink which is brought into surface contact with the LED substrate at the flat plate. The absorbed heat is diffused to the end portions of each heat radiation fin and then heat-exchanged with air taken in by the cooling fan to be efficiently discharged.

DESCRIPTION OF THE PREFERRED EMBODIMENTS

An embodiment of the present invention will be described below with reference to the accompanying drawings.

Figure 1:
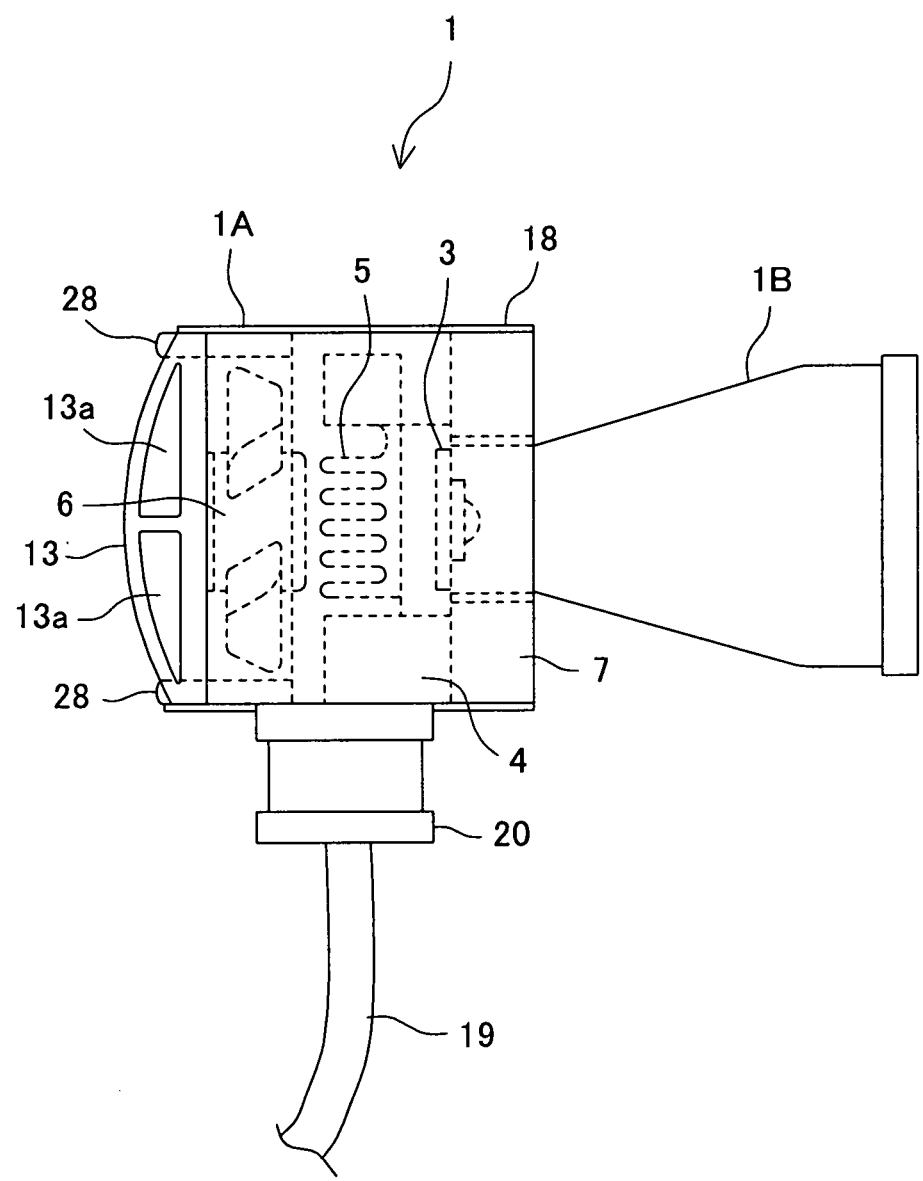
FIG. 1 is a side view of an LED illumination device according to an embodiment of the present invention.

FIG. 1 is a side view illustrating the outer appearance of an LED illumination device 1 according to the present invention. The LED illumination device 1 is constituted of a main body part 1A and an illumination part 1B. The illumination part 1B includes a plurality of convex lenses arranged in a truncated cone-shaped cylindrical body so as to locally irradiate an object with light.

The main body part 1A includes an LED substrate 3, a base 4, a heat sink 5, a cooling fan 6, and an installation member 7 for mounting the illumination part 1B inside a rectangular prism-shaped casing 18. A rear cover 13 having an air inlet 13a is mounted to the opening surface of the casing 18 on the cooling fan 6 side.

Figure 2A:
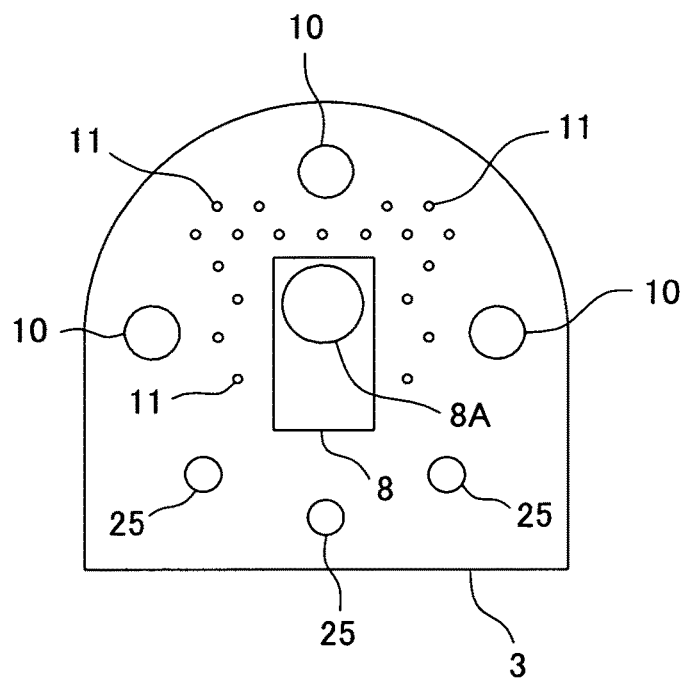
FIG. 2A is a plan view illustrating the configuration of the front surface of an LED substrate in the LED illumination device according to the present embodiment.
Figure 2B:
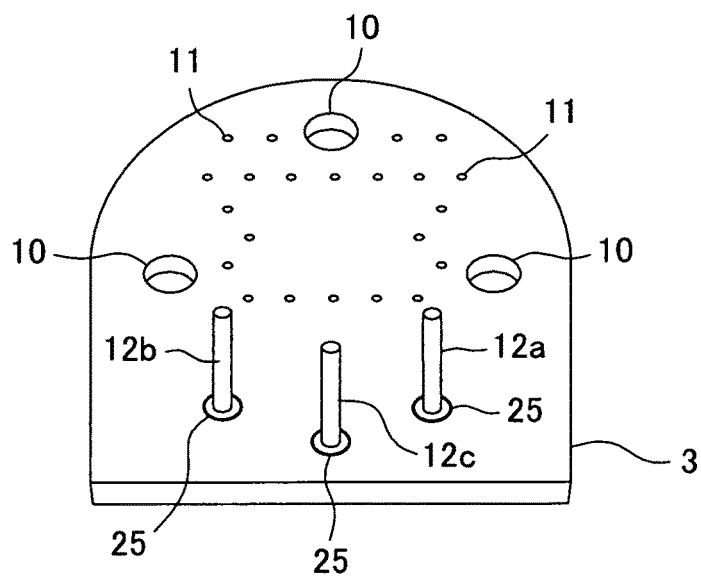
FIG. 2B is a perspective view illustrating the configuration of the rear surface of the LED substrate in the LED illumination device according to the present embodiment.

The LED substrate 3 is formed of resin having high heat conductivity or metal (including its alloy). FIG. 2A is a plan view illustrating the surface (hereinafter, referred to as "front surface") of the LED substrate 3 on the illumination part 1B side, and FIG. 2B is a perspective view illustrating the surface (hereinafter, referred to as "rear surface") opposite to the front surface. A module having an LED package 8 including an LED chip 8A and a driver is mounted by an adhesive on the front surface of the LED substrate 3. As the adhesive, a silicone-based adhesive excellent in heat conductivity is used.

Mounting screw holes 10, small-diameter through holes 11, and lead wire introducing ports 25 are drilled in the LED substrate 3. Feed wires 12a and 12b connected to the respective LED chip and the driver incorporated in the LED package 8 and a common ground wire 12c are made to pass through the three lead wire introducing ports 25.

Figure 3:
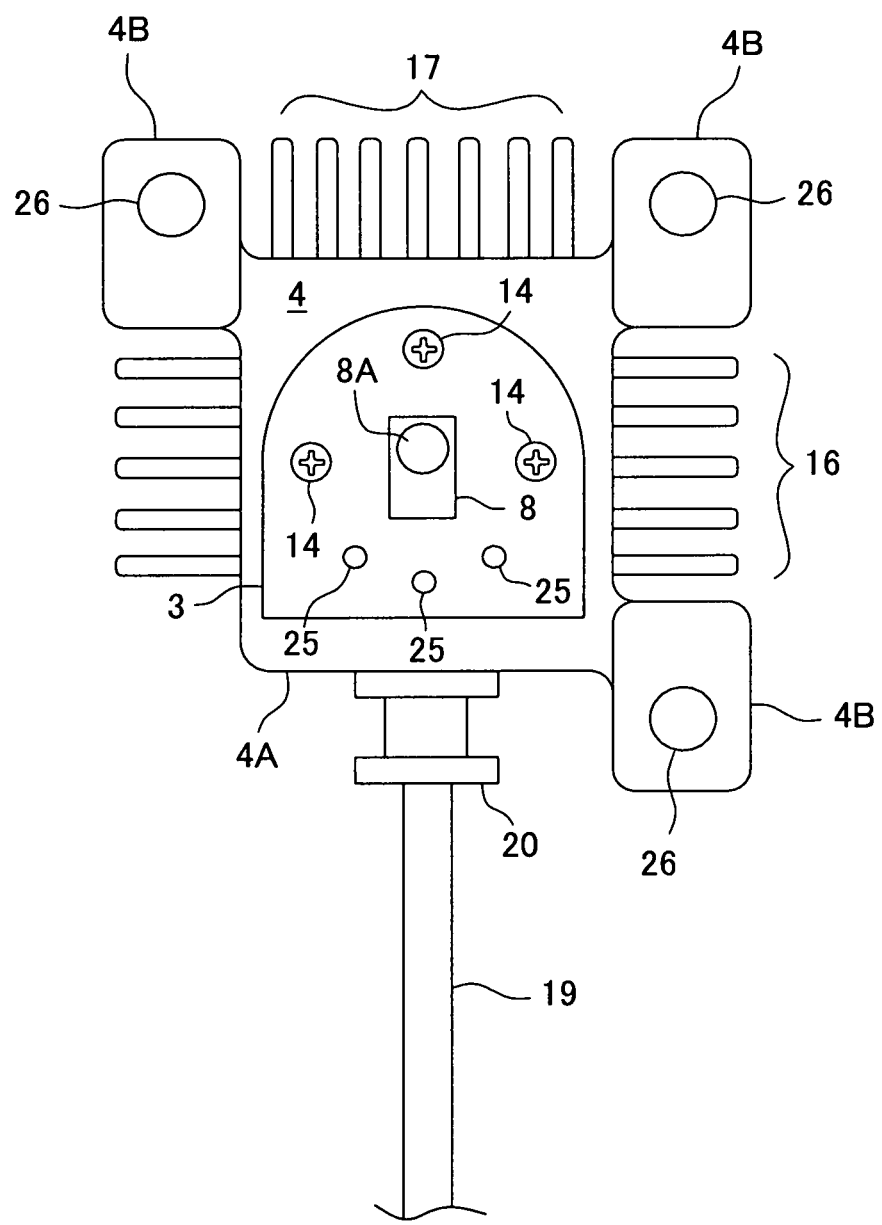
FIG. 3 is a plan view illustrating the front surface of a base in a state where the LED substrate and a heat sink are assembled to the base.

The base 4 holds the LED substrate 3 and is mounted with the heat sink 5. In this case, the base 4 need not necessarily be formed of resin having high heat conductivity. FIG. 3 is a plan view illustrating the front surface of the base 4 in a state where the LED substrate 3 and heat sink 5 are assembled to the base 4. The base 4 is constituted of a center part 4A and mounting parts 4B each with a hole 26 drilled thereinto to allow a screw for assembly penetrates therethrough. The mounting part 4B is disposed on the line extending from a corner of the center part 4A in the diagonal direction so as to face the installation member 7 for mounting the illumination part 1B and protrudes in the axial direction from the rear surface.

A receiving port 20 for a harness 19 inserted from outside is mounted to one side of the center part 4A. Wires in the harness 19 include a feeding wire connected to the LED package 8 and feed and ground wires connected to a cooling fan 6. Although not illustrated, a lead wire drawn out from the harness 19 is connected to the cooling fan 6 and the LED package 8.

The front surface of the base 4 serves as a contact surface with the LED substrate 3 and has a concave part 29 (see FIG. 7) in which the LED substrate 3 is housed. The LED substrate 3 is tightly fitted to the bottom surface of the concave part 29 with a heat radiation grease interposed therebetween and fixed to the base 4 with screws 14 penetrating through the screw holes 10.

Figure 4:
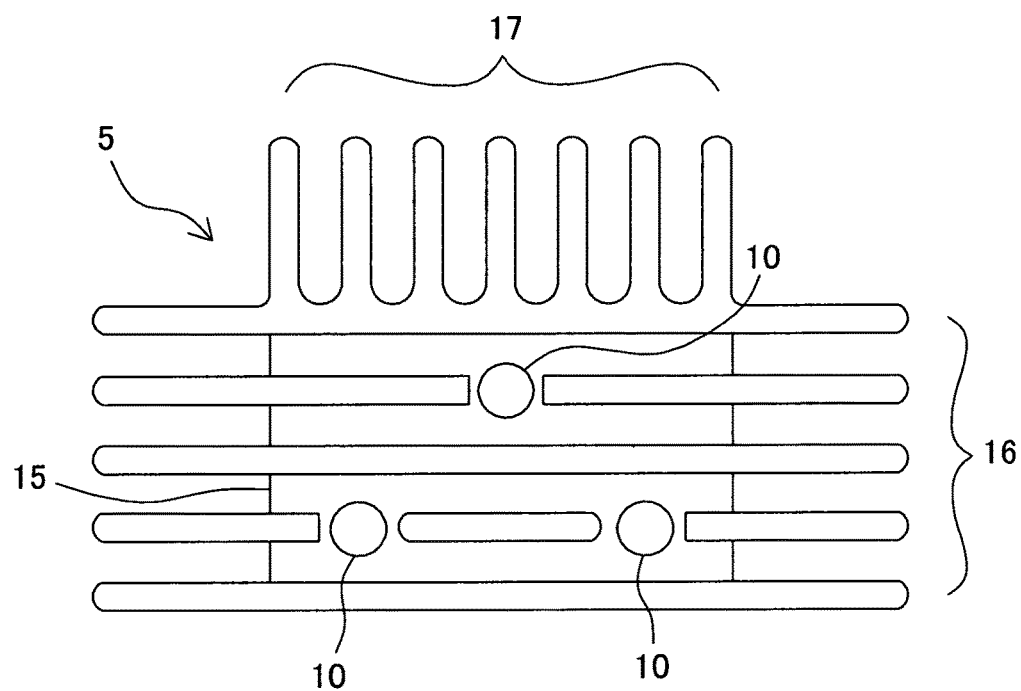
FIG. 4 is a plan view illustrating a heat radiation surface of the heat sink.

The heat sink 5 is formed of aluminum having high heat conductivity or its alloy. As illustrated in FIG. 4, the heat sink 5 is constituted of a flat plate 15, a plurality of rib-shaped heat radiation fins 16, and a plurality of heat radiation fins 17. The rib-shaped heat radiation fins 16 are formed so as to extend over a pair of opposing sides of the flat plate 15 and such that both ends of each thereof protrude outward. Some of the heat radiation fins 16 are cut out at the portion where the screw 14 penetrates through the screw hole 10 formed in the base 4 and heat sink 5. The plurality of heat radiation fins 17 are formed so as to protrude outward from the end portion of a side of the flat plate 15 other than the pair of opposing sides.

The outward protruding part of each heat radiation fin 17 has substantially the same dimension as that of the part of each heat radiation fin 16 that protrudes from the side of the flat plate 15 perpendicular thereto. The surface part of each of the heat radiation fins 16 and 17 to be formed in a plate-like shape extends perpendicular to the surface of the flat plate 15.

Figure 5:
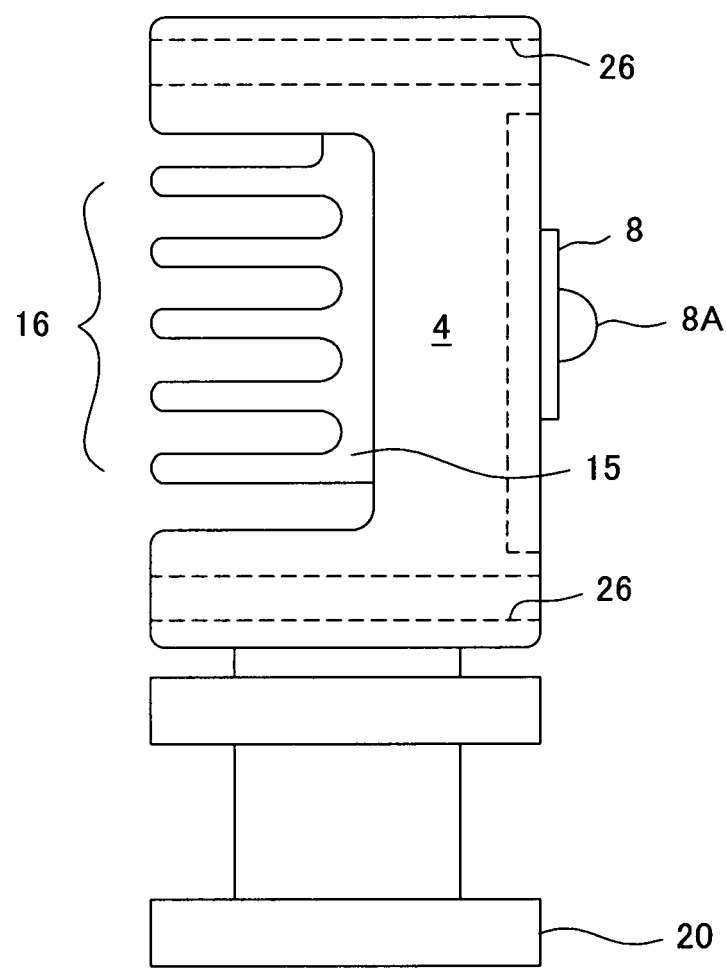
FIG. 5 is a side view of the base in a state where the LED substrate and the heat sink are assembled to the base.

FIG. 5 is a side view illustrating a state where the heat sink 5 is assembled to the base 4. In this state, the both end portions of each heat radiation fin 16 of the heat sink 5 that protrude from the flat plate 15 and each heat radiation fin 17 are exposed from the base 4 as well.

Figure 6:
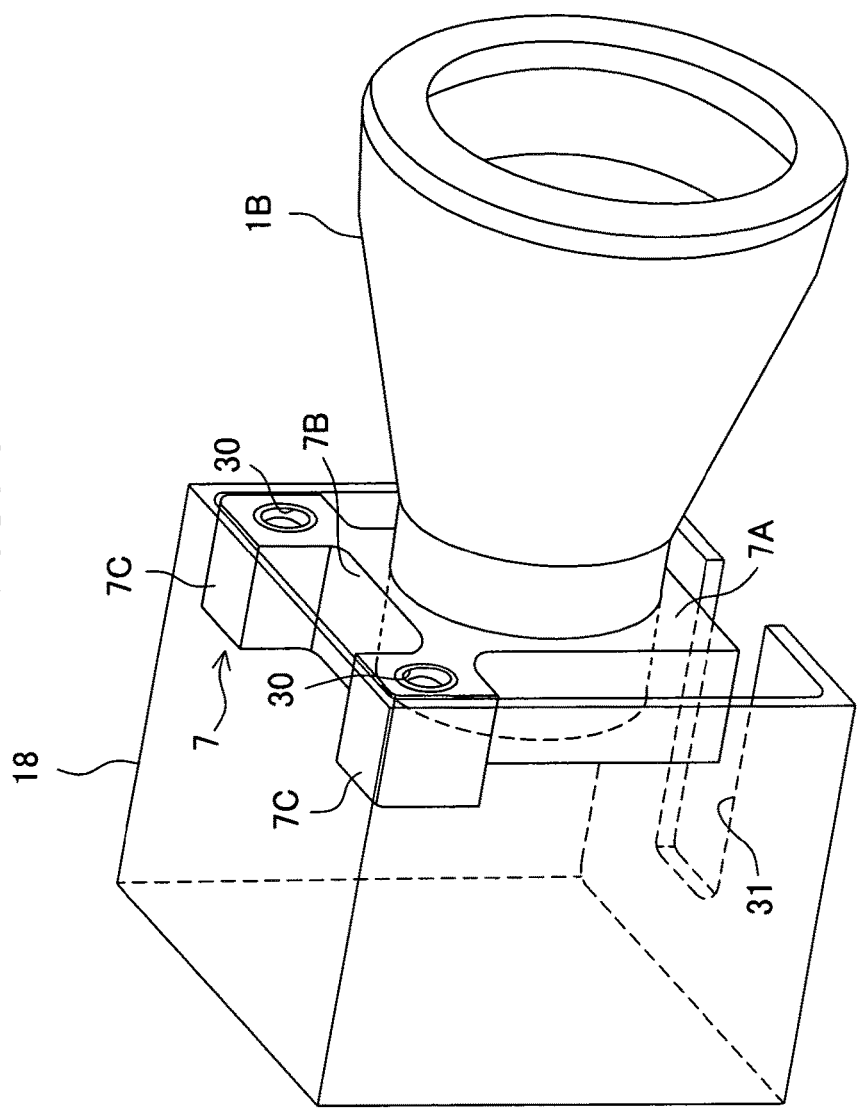
FIG. 6 is an explanatory view in a state where an installation member mounted with an illumination part is set in a casing.

As illustrated in FIG. 6, the center portion of the installation member 7 serves as a mounting part 7A to which the illumination part 1B is fitted. Around the mounting part 7A, an air outlet 7B is formed by cutting out the parts of the mounting part 7A that are opposed to the both ends of each heat radiation fin 16 and each heat radiation fin 17 of the heat sink 5 that protrude from the flat plate 15. A screw hole 30 extending along the axial direction is drilled in three corner parts 7C of the mounting part 7A that contact the corners of the casing 18. The screw hole communicates with the through hole 26 of the mounting part 4B of the base 4.

Figure 7:
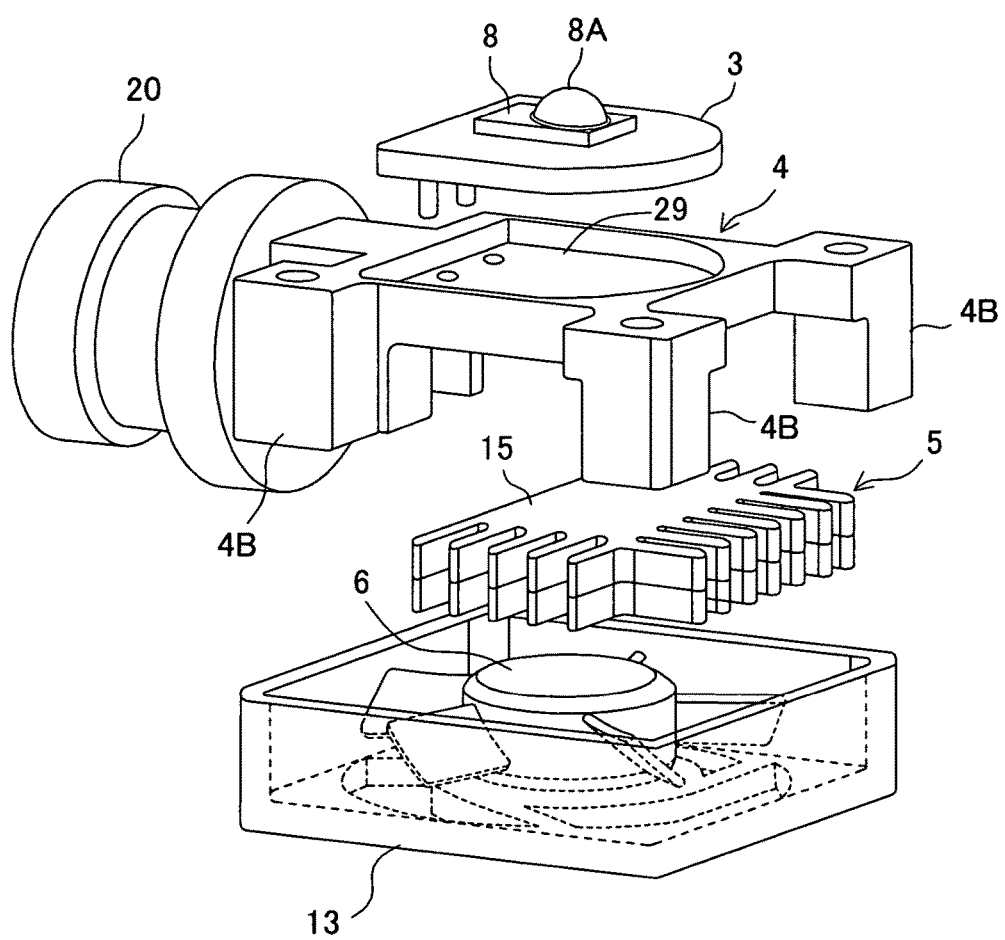
FIG. 7 is a perspective view of the LED substrate, base, heat sink, a cooling fan, and a rear cover which are assembled to form the LED illumination device according to the embodiment of the present invention.

As illustrated in FIG. 7, the cooling fan 6 is an axial flow type fan provided with an impeller 24 driven by a brushless DC fan motor 23, and configured to take in air in the axial direction of the casing 18 from outside through the air inlet 13a of the rear cover 13 by rotation of the impeller 24 and to blow out the air toward the heat sink 5. The rotation diameter of the cooling fan 6 is made substantially equal to the dimension of the heat radiation fins 16 in its linear direction to thereby completely cover the heat sink 5.

Figure 8:
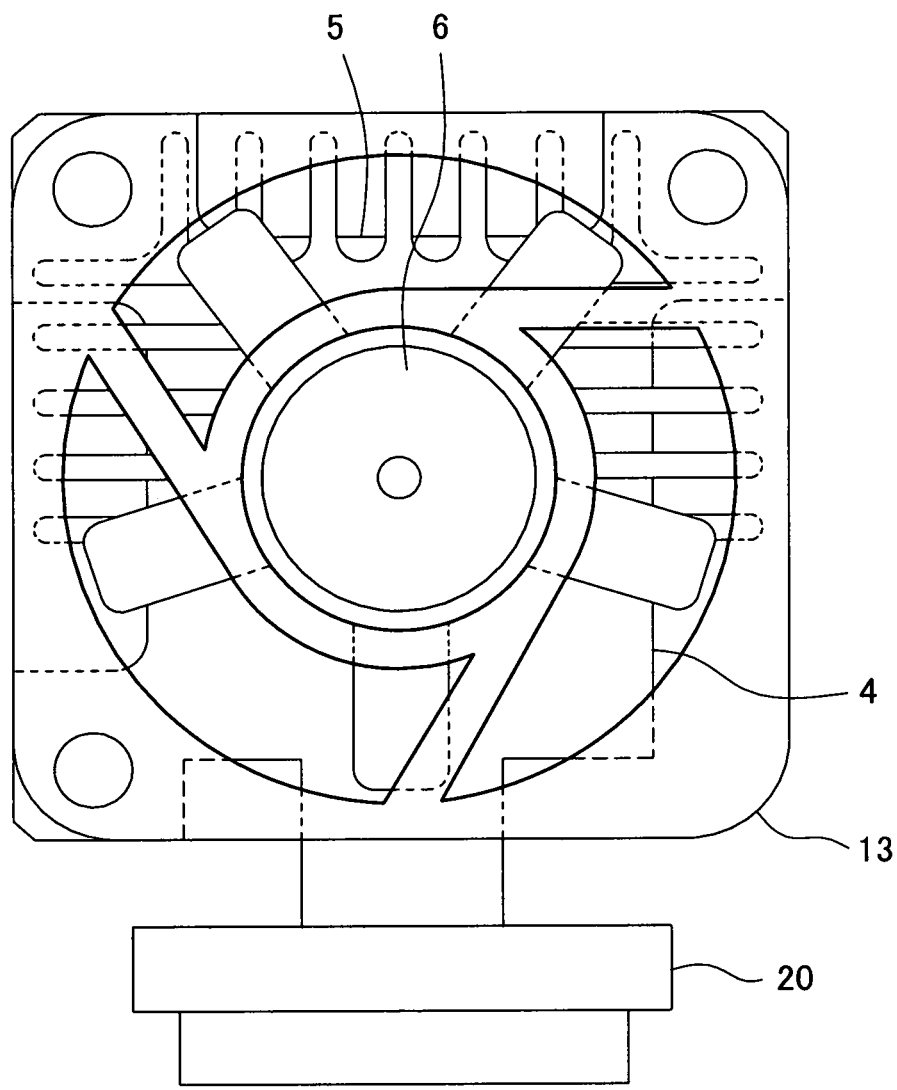
FIG. 8 is a plan view of the base, heat sink, cooling fan, and rear cover as viewed from outside the rear cover.

As illustrated in FIG. 8, the cooling fan 6 is supported and fixed in the casing 18 by the rear cover 13. In this case, the installation member 7 mounted with the illumination part 1B, the base 4 assembled with the LED substrate 3 and heat sink 5, and the cooling fan 6 are overlapped in the axial direction and disposed inside the casing 18, and the rear cover 13 is put on the suction side of the cooling fan 6, followed by fastening by means of screws 28, whereby the LED illumination device 1 is completed. A slit 31 is formed in the casing 18. At assembly of the LED illumination device 1, the slit 31 serves as a recess part for the receiving port 20 to be inserted into the casing 18 when the base 4 is housed therein.

Figure 9:
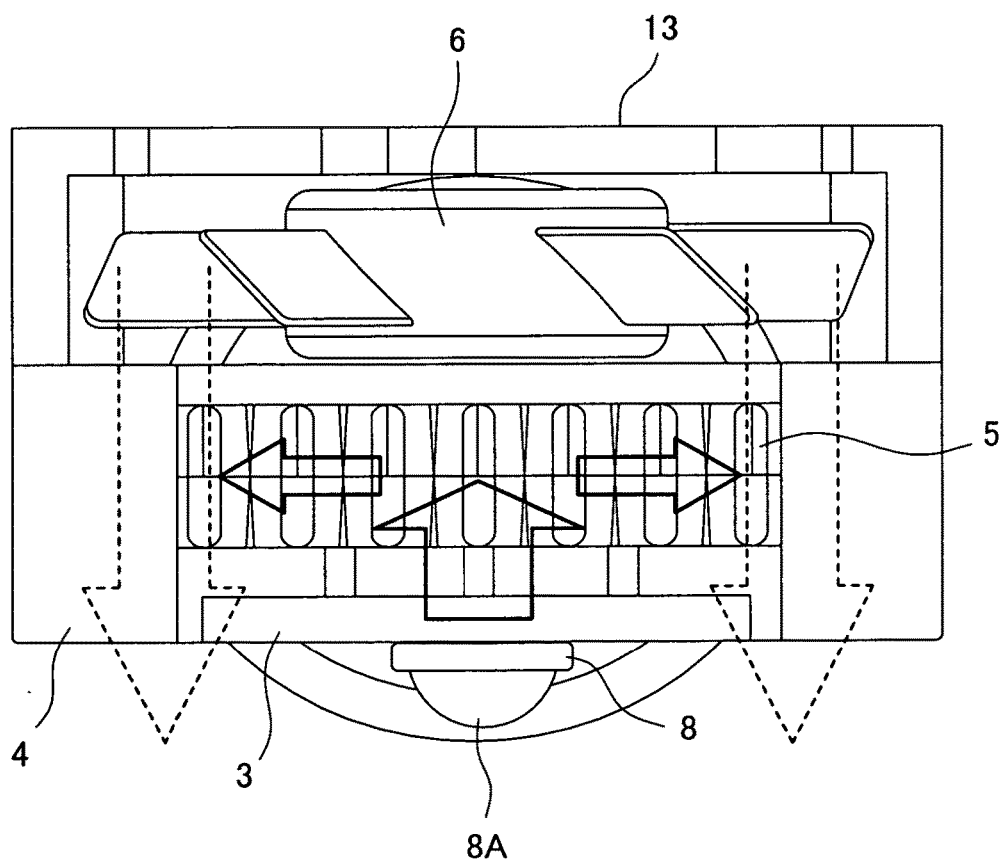
FIG. 9 is a view for explaining a state where heat from the LED substrate is absorbed by the heat sink and radiated by air taken in by the cooling fan.

The heat radiation effect of the LED illumination device 1 having the above configuration will be described. As illustrated in FIG. 9, heat generated in the LED package 8 at illumination is transmitted to the LED substrate 3 in the continuous-line arrow direction. The LED substrate 3 is housed in the concave part 29 formed in the front surface of the base 4 so as to be tightly fitted thereto, and the heat transmitted to the LED substrate 3 is discharged to the base 4 through the heat radiation grease. At this time, the screws 14 for fixing the LED substrate 3 to the base 4 also contribute to heat conduction.

The LED substrate 3 is thus housed in the concave part 29, so that the base 4 effectively absorbs the heat from the LED substrate 3, thus making it possible to reduce a heat radiation amount from the LED substrate 3 to the illumination part 1B. Further, air in the illumination part 1B directly exchanges heat with the base 4 through the through holes 11 formed in the LED substrate 3, which also contributes to suppression of temperature rise in the illumination part 1B.

The heat transmitted to the base 4 is transmitted to the flat plate 15 of the heat sink 5 from the center part 4A of the base 4 and is then diffused to the heat radiation fins 16 and 17. In the heat radiation fins 16 and 17, the heat is conducted to its outward protruding part. The cooling fan 6 is driven by the motor 23 to take in air in the axial direction from the air inlet 13a and forms an air passage denoted by the dashed-line arrows along which the taken-in air is discharged from the air outlet 7B. Thus, in the heat radiation fins 16 and 17, the heat radially diffused outward is cooled by the air taken in by the cooling fan 6. Since the both end portions of each heat radiation fin 16 and each heat radiation fin 17 are exposed from the sides of the base 4 protruding outward from the three sides of the flat plate 15, the air taken in by the cooling fan 6 passes between the surfaces of the heat radiation fins to be discharged without being blocked.

The cooling fan 6 forms the air passage as described above and, thereby, the heat conducted from the LED substrate 3 to the base 4 is effectively heat-exchanged with the air taken in through the heat sink 5 to be radiated outside. Then, the air blown-off from the air outlet 7B passes through the surface of the illumination part 1B, whereby heat is also exchanged with the illumination part 1B. Thus, the heat radiation performance of the LED illumination device 1 is improved.

In the above embodiment, the receiving port 20 for the harness 19 is provided in one side of the base 4, so that the heat radiation fins (heat radiation fins 16, 17) are provided in only the three sides of the flat plate 15; however, the heat radiation fins can be provided corresponding to the four sides of the base 4 depending on the layout of the receiving port 20.

What is claimed is:

1. An LED illumination device comprising:
    an LED substrate;
    an LED package mounted on the LED substrate;
    a base having a first surface, a second surface opposite the first surface, and a concave part formed on the first surface for receiving the LED substrate;
    a heat sink including
        a rectangular flat plate having a main surface thermally connected to the second surface of the base, and a heat radiation surface opposite the main surface, and
        a plurality of first heat radiation fins having a rib-shape and protruding from the heat radiation surface of the flat plate, the first heat radiation fins extending from a periphery of the flat plate at two opposing sides;
    a cooling fan; and
    a casing housing the LED substrate, the base, the heat sink, and the cooling fan, wherein
    the base is shaped such that a part of each first heat radiation fin extending from the periphery of the flat plate is exposed from the first surface of the base,
    the cooling fan takes in air from outside of the casing in a direction substantially orthogonal to the heat radiation surface and through the first heat radiation fins, and
    the LED substrate has a through hole so as to allow air in an illumination part to contact the base.

2. The LED illumination device according to claim 1, wherein
    a diameter of the cooling fan is substantially equal to a length of the first heat radiation fins in a transverse direction.

3. The LED illumination device according to claim 1, wherein the heat sink further includes a plurality of second heat radiation fins protruding from the heat radiation surface of the flat plate by substantially a same size as those of the first heat radiation fins and from the periphery of the flat plate at a side other than the two opposing sides thereof, and
    the base is further shaped such that the second heat radiation fins are exposed from the first surface of the base.

* * * * *